United States Patent [19]

Swartz

[11] 4,029,542

[45] June 14, 1977

[54] METHOD FOR SLOPING THE SIDEWALLS OF MULTILAYER P+PN+ JUNCTION MESA STRUCTURES

[75] Inventor: George Allan Swartz, Plainsboro, N.J.

[73] Assignee: RCA Corporation, New York, N.Y.

[22] Filed: Sept. 19, 1975

[21] Appl. No.: 614,889

[52] U.S. Cl. .............................. 156/649; 156/657; 156/662; 252/79.3

[51] Int. Cl.² ...................................... H01L 21/306

[58] Field of Search ............... 156/7, 8, 17, 3, 648, 156/657, 662, 649; 252/79.3; 204/129.75

[56] References Cited

UNITED STATES PATENTS

| | | | |
|---|---|---|---|
| 3,007,830 | 11/1961 | Bardsley | 252/79.3 |
| 3,607,480 | 9/1971 | Harrap et al. | 156/17 |
| 3,811,974 | 5/1974 | Squillace et al. | 156/17 |
| 3,894,895 | 7/1975 | Khandelwal | 156/8 |

*Primary Examiner*—Charles E. Van Horn
*Assistant Examiner*—Jerome W. Massie
*Attorney, Agent, or Firm*—H. Christoffersen; Robert P. Williams; William L. Muckelroy

[57] ABSTRACT

A method for insuring that the sidewall of a P+ PN+ layered junction mesa semiconductor structure is tapered smoothly from the P layer to the N+ layer of the structure upon formation thereof by immersion of a wafer comprised of the structure in an etchant of 3% HF and 97% HNO₃, comprising the steps of placing an etch mask dot having a diameter slightly less than the greatest diameter required for the N+ layer above the P+ layer at a preselected site on the wafer, preselecting a specific ratio of etchant quantity to P silicon quantity, immersing the wafer in the preselected quantity of the etchant, and withdrawing the wafer from the etchant at the instant at which the silicon is removed from around the dot.

2 Claims, 12 Drawing Figures

METHOD FOR SLOPING THE SIDEWALLS OF MULTILAYER P+ PN+ JUNCTION MESA STRUCTURES

This invention relates specifically to the fabrication of P+PN+ layered semiconductor devices, and particularly to positively sloping the sidewalls of pellets or mesas of such devices and tapering the diameters perpendicular to a central principal symmetry axis thereof to improve the high voltage breakdown capability at the sidewall and to achieve a desired junction capacitance therefor.

It is known that a 97% nitric acid-3% hydrofluoric acid etchant etches N and P silicon at substantially different rates, one cause of the negative beveled or sloped sidewalls for the mesas in the N+ region which produces an N+ layer narrowing from the PN junction to a supporting heat sink. Thus, a need exists for an improved method, compatible with the above-described process, for positively rather than negatively sloping a greater number of the N+PN+ mesa sidewalls.

It is now well known to contour, i.e., slope or bevel, the sidewalls of semiconductor pellets to provide a particular angle between the sidewall and a plane containing a PN junction. As known, such angling or beveling of the edge increases the width of the depletion layer of a given PN junction at the surface of the pellet, thereby reducing the electric field strength at the pellet surface and increasing the voltage breakdown capability of the device. See, for example, J. Cornu, "Field Distribution Near the Surface of Beveled P-N Junctions in High-Voltage Devices", *IEEE Transactions on Electron Devices*, Vol. ED-20, No. 4, April 1973, p. 347.

In the fabrication of one type of semiconductor device, for example, one comprising a disc-like semiconductor pellet or mesa, P+, P and N+ planar regions are sequentially formed, for example, on a P+ wafer wherein the P and N+ regions make a PN junction which is generally parallel to the major surface of the wafer. The P+ wafer is subsequently removed and metal contact layers and a metal heat sinking layer layer or substrate are deposited. The locations of the pellets are defined by periodically placed metal dots using known photolithographic techniques. Portions of the major surface of the P+ regions nearest the dots are exposed using conventional ion-beam millng techniques. Mesas supported by the metal sink are defined by etching through the semiconductor regions, the dots serving as etch masks. Individual pellets are formed from the mesas by cutting or etching grooves, in accordance with the grid-like pattern of the dots, through the metal heat sink.

Mesas have been formed by first masking the desired areas of a planar region, thereby exposing the undesired regions and subsequently exposing the undesired regions to a suitable etchant for a specific predetermined period of time. In the manufacture of TRAPATT or IMPATT diodes comprising adjacent, stacked P+, P and N+ silicon, the undesired regions have been etched in a randomly selected quantity of 97% $HNO_3$ -3% HF solution for an experimentally predetermined period of time. This silicon mesa forming etching process as known often provides a device yield of approximately 10% to 20% because of undercutting of the N+ region. The inventor has discovered that a major factor in the process as known is the quantity of the etchant used with respect to the quantity of P+ and P silicon first contacted and dissolved by the etchant before the etchant contacts the N+ region or layer. The novel method of the present invention constrains or preselects the quantity of the etchant that will initally contact the P silicon to a predetermined ratio of etchant to P and/or P+ silicon to be etched away or dissolved and thereby increases the yield spectacularly. Yields of approximately 50% to 60% are regularly achieved, an increase of several hundred percent over the prior art.

Etched TRAPATT and IMPATT diodes should have a preselected junction capacitance for proper integration into a circuit. This capcitance is a function of the area of the junction, defined in the novel method of the present invention by the metal etch mask dots, and the total impurity concentration of the N+ semiconductor region under the junction. Prior to fabricating the devices, a determination of the impurity concentration across the N+ region is made and those areas which are most likely to yield the preselected junction capacitance are selected for use in fabrication. Heretofore, the production of properly tapered devices in the selected area has been left largely to chance.

Silicon pellets produced by another known method each have a base diameter, the diameter of a major surface of the pellet adjacent a substrate, ranging from 150 to 200 micrometers and are bonded to a diamond heat sink. There a 5 parts nitric and 3 parts hydrofluoric solution is used to etch the base diameter down to 75 to 100 micrometers. The reduction in base diameter reduces leakage current and the diode reverse current-voltage characteristic, a cause of premature diode failure. The etchant undercuts an N+ region in a majority of pellets. See "Solid State Amplifier for Spread Spectrum Communication" by T.T. Fong and R.S. Ying, Hughes Research Laboratories, Report No. RADC-TR-75-56, February, 1975.

Figure 1:
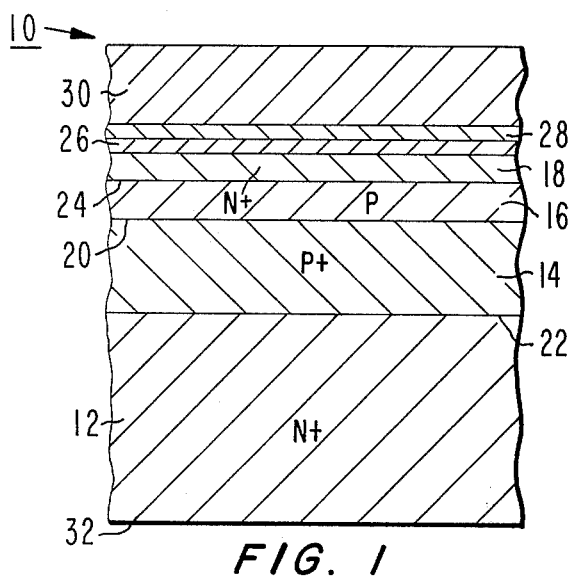
FIG. 1 is a cross-sectional view of a portion of a semiconductor work pieces of known type which can be used in the practice of the method of this invention.

Referring to FIG. 1, a work piece 10 is shown which has been processed, according to known techniques. The work piece 10 comprises, for example, a wafer 12 of heavily doped N+ monocrystalline silicon, and contains three parallel planar monocrystalline regions, for example, a heavily doped P+ region 14 having a thickness of about 3 to 4 $\mu$m, a moderate conductivity P region 16 having a thickness of about 1 to 1.5 μm, and a high conductivity N+ region 18 having a thickness of approximately 0.5 μm. The P+ region 14 and the P region 16 have a P+P interface 20 therebetween, the N+ wafer 12 is adjacent a surface 22 of the P+ region 14, and the N+ region 18 and the P region 16 have a PN junction 24 therebetween. Disposed adjacent the N+ region 18 is a chromium layer 26 having a thickness of about 0.01 μm. Disposed on top of the chromium layer 26 is a platinum layer 28 having a thickness of about 0.25 μm. Disposed adjacent the platinum layer 28 is a thick layer of metal, for example, a copper layer 30 serving as a heat sink and having a thickness of about 75 μm.

In this embodiment, for example, the N+ wafer 12 has a resistivity of 0.003 ohm-cm., the P+ region 14 has a resistivity of 0.001 ohm-cm., the P region 16 has a resistivity of 1.0 ohm-cm., and the N+ region 18 has a resistivity of 0.003 ohm-cm. These details of the work piece 10 are given by way of example only, such details being in no way critical to the practice of the invention.

Although the metal layers 26 and 28 are exemplified as chromium and platinum, any suitable metal serving the purposes of these layers may be used in the practice of the invention. The platinum layer 28 is used essentially to act as a diffusion barrier to prevent a copper layer 30 thereabove from diffusing into the silicon. The chromium layer 26 is used essentially to facilitate the joining of the platinum layer 28 to the silicon work piece 10. In addition, any suitable material usable as a heat sink may be substituted for the copper of the layer 30. Layers 26, 28 and 30 form a heat sinking substrate of the work piece 10.

Figure 2:
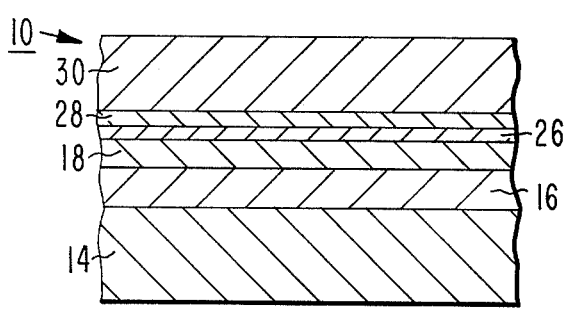
FIG. 2 is a cross-sectional view of the work piece shown in FIG. 1 after a further processing step is performed thereon.

Next, a surface 32 of the work piece 10, shown in FIG. 1, is contacted with a selective etchant which removes the N+ substrate 12 and effectively stops etching at the P+ layer 14. These techniques are well known in the art and are aptly described, for example, in U.S. Pat. No. 3,846,194 issued to Cheng Paul Wen et al. The resulting structure is illustrated in FIG. 2.

Figure 3:
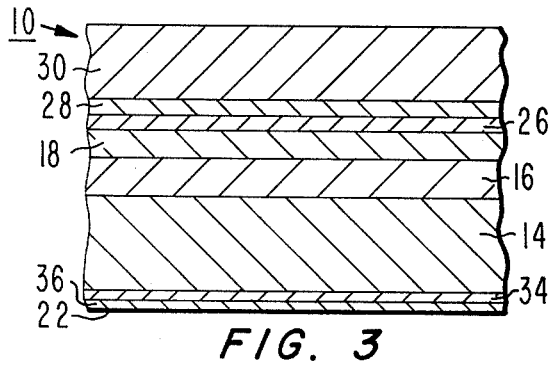
FIGS. 3 through 5 are cross-sectional views of the work piece shown in FIG. 1 after additional further processing steps are performed thereon.
Figure 4:
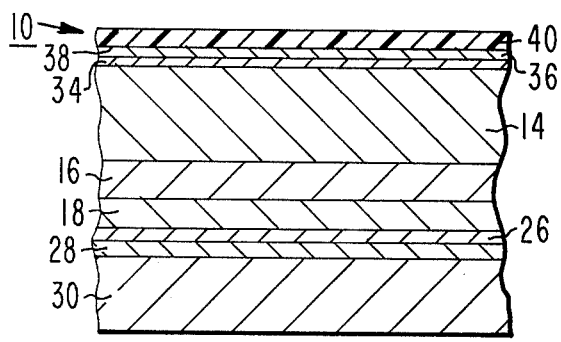
Figure 5:
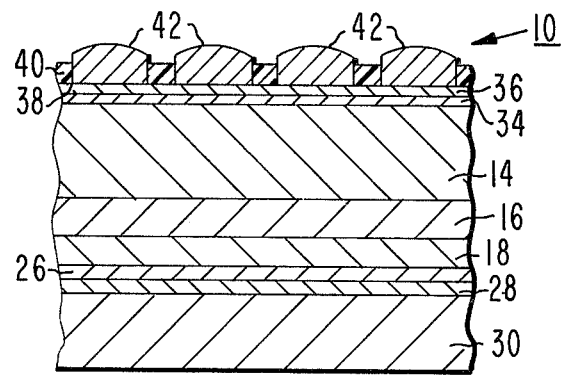
Figure 6:
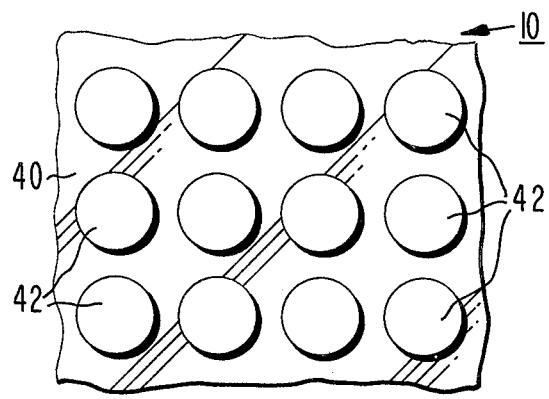
FIG. 6 is a plan view of the work piece portion shown in FIG. 5.

Thereafter, two layers of metal are deposited such as, for example, a chromium layer 34 disposed adjacent the surface 22 and a platinum layer 36 disposed adjacent the chromium layer 34. A surface 38 of the platinum layer 36 of the work piece 10, illustrated in FIG. 4 upside down with respect to FIG. 3, is then coated with a layer 40 of a photoresist, for example, the known Kodak company KPR material. In FIG. 5, the surface 38 of the work piece 10 is shown covered with a layer 40 of photoresist, and a plurality of dots 42 plated thereon having a thickness of about 10 μm, for example, comprised of a metal, gold, for example. Apertures in the phtoresist layer 40 for the gold dots 42 are provided by known photolithographic techniques. The gold dots 42 are shown in plan view in FIG. 6.

Figure 7:
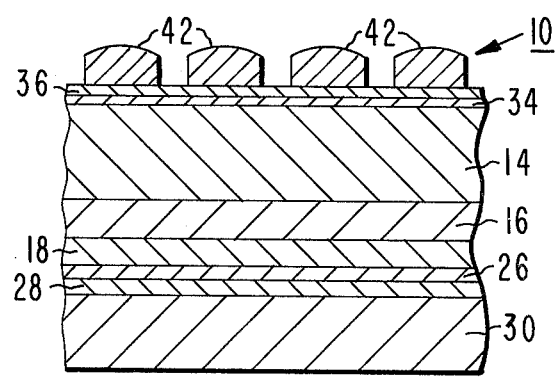
FIGS. 7 through 9 are cross-sectional views of a portion of the semiconductor work piece shown in FIG. 5 after further processing steps are performed thereon.

The photoresist layer 40 may be removed as shown in FIG. 7, by methods commonly known in the art such as, for example, the solvent trichloroethlyene or xylene. The dots 42 remain adjacent the platinum layer 36 and mask certain portions thereof as previously illustrated in FIG. 6 As shown, the dots 42 have widths somewhat greater than the spacing thereinbetween. However, the dimensions are not critical to the practice of the invention and accordingly, the spacings between the dots 42 may be much greater than the diameter of the dots in particular instances.

Figure 8:
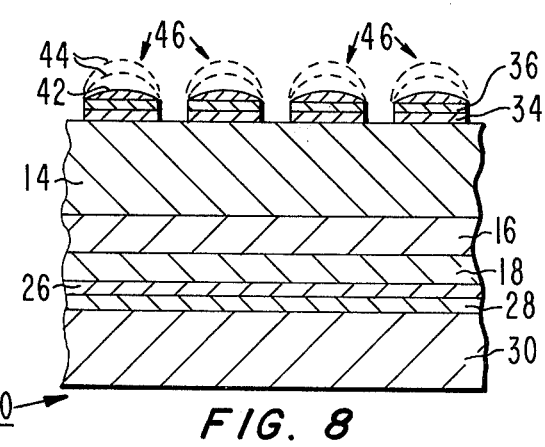

Thereafter, as shown in FIG. 8, portions of the platinum layer 36 and the chromium layer 34 are removed by ion beam milling of the principal surface of the work piece 10 onto which the gold dots 42 are disposed. A beam of high energy argon ions (not shown) is directed at the platinum surface until the platinum layer 36 and the chromium layer 34 are spattered off by the impinging ions.

The result of the ion beam milling process is shown in FIG. 8, dashed lines 44 being used to indicate the progressive results of the milling process after successive periods of time upon the gold dots 42. As shown by the solid lines, the end result of the etching of the milling process are cylindrical dots 46 comprising a layer of gold at the top spaced by successive layers of chromium, 34, and platinum, 36, away from the semiconductor layer 14.

Figure 9:
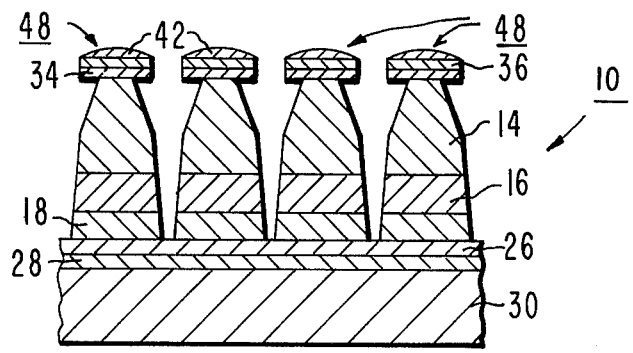
Figure 10:
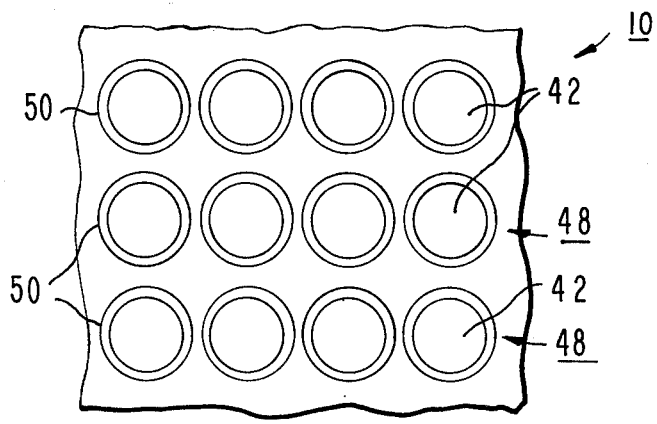
FIG. 10 is plan view of the work piece portion shown in FIG. 9.
Figure 11:
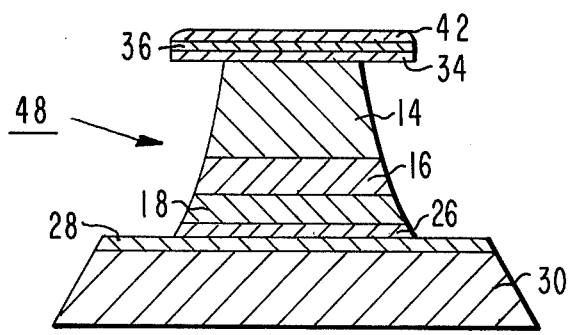
FIG. 11 is a cross-sectional view on an enlarged scale compared to that in FIG. 9, showing one side of a pellet formed from the work piece shown in FIG. 9 after a still further step in the processing sequence.

Thereafter, the work piece 10 as shown in FIG. 8 is immersed in a selected quantity of an etchant at a temperature of approximately 25° C comprised of 3% hydrofluoric acid and 97% nitric acid which initially rapidly attacks the material of the work piece 10 with the exception of the cylindrical dots 46 thereon comprised of the gold dots 42, and the metal layers 26, 28, 30. The etchant comprises etchant molecules which consist of hydrofluoric acid (HF). The selected quantity is preferably such that the ratio of etchant to P silicon is $6.3 \times 10^4$ ml. of etchant per cc. of etchable P silicon, irregardless of the doping density. Exposed semiconductor portions of the work piece 10 specifically, layers 14, 16 and 18, are thus etched away to form the mesas 48 shown in FIG. 9. To slope the N+ layer 18 of the mesas 48 as shown in FIGS. 9 and 11, removal of the semiconductor material of layers 14, 16 and 18 is observed from above the gold dots 42 in a previously selected and desirable area of the work piece 10. The work piece 10 is withdrawn from the etchant when the reflectivity of the area around the rings 50 in FIG. 10 changes.

The selection of a quantity of etchant based on the above-specified ratio substantially increases yields to over 50%. Moreover, another improvement in the etching process, wherein the rings 50 are used to indicate capacitance and the work piece 10 is withdrawn from the etchant upon the formation of the rings 50 instead of at the end of a predetermined or preselected period of time has also substantially increased the yield of devices produced by this method. The improvement comprising either the step of removing the work piece 10 upon formation of the ring 50 or the step of preselecting the quantity of etchant according to the novel specific ratio of etchant to P silicon permits the termination of the etching process at that instant at which a majority or a substantially greater portion of the mesas 48 than in the process as heretofore known have portions of the layer 18 thereof mutually separated but not undercut.

In using a quantity of etchant wherein the volumetric ratio of the 3% hydrofluoric—97% nitric acid etchant to etchable or dissolvable cubic centimeters of P silicon is selected to be approximately $6.3 \times 10^4$, the molecular ratio is approximately 631 molecules of hydrofluoric acid (HF) for each molecule of silicon (Si). The activity of this etchant when it contacts the N+ layer is significantly slowed and the sidewall of the P layer thereabove and the N+ layer is properly sloped outward away from the center of the mesa and away from the PN junction. The result is that a first diameter for the P layer 16 above the PN junction is small with respect to a first diameter for the N+ layer 18 at the PN junction, the diameters in between the first diameter for the P layer and the last diameter for the N+ layer at an interface with the heat sinking substrate increasing from the first diameter for the P layer to the last diameter for the N+ layer.

The etching step involves, in effect, three separate etchants and etching quantities. The etchant contacting the P+ layer is a first etchant consisting of 3% HF—97% HNO$_3$ of a preselected volumetric quantity according to the novel aforeprescribed ratio.

In utilizing a predetermined period or duration for the etching process, due to the speed of the etching action, it is extremely difficult to prevent the etchant from negatively sloping the N+ layer 18 comprising the base of the mesas 48. In the known process, wherein the work piece 10 is permitted to remain in a relatively large quantity of the etchant for a predetermined period of time, the N+ silicon layer 18 is undercut in a majority of the mesas to form a structure such as that illustrated in FIG. 12, with resultant yields of structures as that shown in FIG. 11 of about 10%. With the present method of the invention, structures such as shown in FIG. 11 may be produced about 60% of the time, that is, with yields of about 60%.

Figure 12:
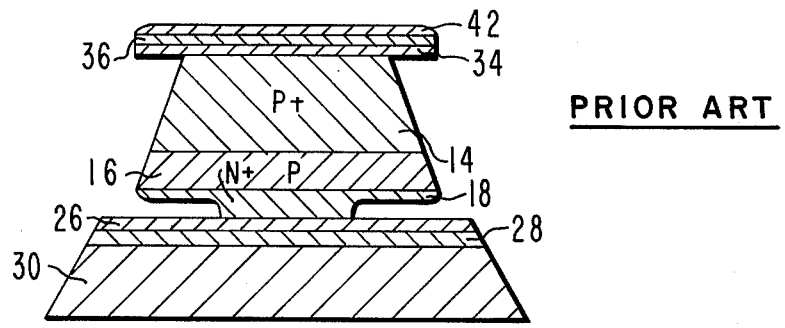
FIG. 12 is a cross-sectional view of a pellet produced using a prior art processing sequence.

According to well known etching theory the P layer 16 in FIG. 12 adjacent the N+ layer 18 should act as an etch mask for the layer 18. It is commonly expected that because the P layer 16 etches at a slower rate than the N+ layer 18 an overhanging region should be produced adjacent the N+ layer 19 with the N+ layer 18 recessed and of a smaller diameter than the P layer 16 at the PN junction. Scanning electron photomicrographs have not revealed this. Instead, the structure as shown in FIG. 12 is produced upon overetching of the N+ layer 18. However, a differential etch rate for the P+ and P silicon layers is manifested in the scanning electron photomicrographs. A rounded corner is sometimes produced at the P+P interface 20 between layers 14 and 16. Upon the removal of the P+ layer 14 the percentage of HF with respect to HNO$_3$ will have changed to a lower percentage, for example, 2.99% HF to 97.01% HNO$_3$. The first quantity has also changed to a different effective volume because some of the etchant has combined with the silicon oxides. The etchant contacting the P layer 16 is therefore a second etchant of a second quantity emanated from the first etchant and comprising HF and HNO$_3$. A similar change occurs upon the removal of the P layer 16 such that the etchant contacting the N+ layer is effectively a third etchant of a third quantity emanated from the second and first etchants, comprising HF and HNO$_3$.

The second etchant has an etch rate with respect to P silicon substantially the same as that of the third etchant with respect to the N+ silicon. An outward sloping from the PN junction through the N+ to the heat sink as desired is produced. The first etchant has an etch rate with respect to P+ silicon which is slower than the etch rate of the second etchant with respect to P silicon. Thus, a rounded and slightly undercut P+P interface is usually produced. However, the operation of the structures is not adversely affected. The etch rate of the first etchant with respect to either P+ or N+ silicon is substantially greater than the etch rate of the third etchant with respect to N+ silicon. The molecular quantity of active HF in the third etchant is approximately 1% less than that of the active HF present in the first etchant.

Thus, the steps of selecting a quantity for the etchant molecules for the etchant and selecting a quantity for the molecules in a portion of the first layer comprised of layers 14 and 16, which portion is dissolved or removed by the etchant and consuming a preselected portion of the etchant molecules causes the above etch rates whereby a second layer, the N+ layer 18, is etched by the etchant at substantially the same rate as the layer 16. The preselected portion of the etchant molecules which are consumed are determined by the selected quantity for the first layer molecules and the quantity selected for the etchant molecules.

FIG. 11 shows an enlarged and less distorted view of a pellet comprising one of the mesas 48 from the work piece 10 shown in FIG. 9. The mesa 48 is shown having a sidewall 52 sloped or tapered away from the gold dot 42 disposed above one of the principal surfaces of the mesa toward the copper layer 30 and away from the principal symmetry axis of the mesa 48. In addition, the N+ layer 18 is similarly sloped and is not undercut. The layer 18 has a tapered diameter increasing beyond that of the adjacent semiconductor layer 16.

In the method of the present invention the gradually sloping or tapering sidewall 52 is produced by use of a weakened or relatively slow etchant for the N+ layer. In contrast a relatively faster etchant is used for the P layers 14 and 16. This is accomplished by the discovery that a selected amount of P type silicon dissolved into a selected small quantity of etchant alters the etch rate for the 3% HF-97% HNO$_3$ nitric acid etchant in such a fashion that undercutting of the P layer 16 as well as inward tapering of the N+ layer 18 toward the center of the mesa 48 is prevented. The nitric acid of the 3% HF-97% HNO$_3$ solution first forms an oxide of silicon on the surface of the silicon in the work piece 10. Subsequently, the hydrofluoric acid etches the oxide of silicon. Because of the small quantity of HF acid in solution a major portion thereof is used up during the etching of the P layers. This consumption of the HF acid weakens and slows the etchant action on the N+ silicon layer. The more HF initially present the faster the etchant, for example, 3% HF, 97% HNO$_3$ is faster than 2% HF, 98% HNO$_3$. A larger quantity of the etchant would not be appreciably affected by the amount of P type silicon dissolved.

In one practical example, it has been found that a work piece of a wafer having the aforementioned layers and gold dots thereon, 0.2 inches by 0.5 inches, provides enough soluble P type silicon upon etching the P layers 14 and 16 to adequately slow the etching rate for the solution with respect to the N+ layer 18 when the quantity of the etchant is restricted to 20 milliliters. There are approximately 500 gold dots on a work piece of this size. As aforedescribed, the work piece remains in the etchant until the rings appear. The work piece is then removed and rinsed in water for 30 seconds and afterwards placed in a solution of 50% HF, 50% water for 30 seconds. Subsequently, it is again rinsed in water for 45 seconds and spun dry.

Although the invention is presented in terms applicable to a work piece 10 comprised of semiconductor laers particularly of silicon, the method of the invention is equally applicable to other semiconductor materials and as, for example, gallium arsenide wherein there is a substantially higher etch rate in subjacent doped layers of the semiconductor.

The presence of the metal dots 42 and the subsequent observance of the rings 50 formed therearound by complete etching of the portion of the N type semiconductor layer 18 surrounding the dots consistently provides a known PN junction area and junction capacitance for TRAPATT and IMPATT devices so formed by the method of the invention. Formation of the rings 50 in a preselected area on the work piece 10 insures the production of properly tapered devices from that portion of the work piece. Thus, the probability of the production of a properly tapered device from that portion of the work piece 10 is substantially increased.

What is claimed is:

1. In a method for making a junction mesa structure from a semiconductor wafer wherein the wafer comprises a first layer having a masked area and an unmasked area comprising first layer molecules, a substrate, and a second layer comprising second layer molecules in between the first layer and the substrate and adjacent first layer and the substrate, the first layer and the second layer adapted to etch at substantially different etch rates in an etchant comprising 3% hydrofluoric acid and 97% nitric acid, the etchant further comprising etchant molecules which chemically remove first layer molecules from the first layer and second layer molecules from the second layer, the second layer molecules being removable substantially faster than said first layer molecules, the method comprising the steps of first contacting all of the unmasked area of the first layer with said etchant, removing the unmasked area of the first layer and removing a portion of said second layer unmasked by the masked area of the first layer, the improvement comprising the steps fo providing a known total quantity of the etchant molecules in the amount of 63 liters of etchant per cubic centimeter of the first layer in the unmasked area, providing a known total quantity of the first layer molecules in the unmasked area such that a ratio of said known total quantity of etchant molecules to said first layer molecules in the unmasked area is approximately 631:1 and chemically consuming a known part of the etchant molecules by using said known part to consume the unmasked area of the first layer, and unconsumed quantity of the etchant molecules remaining after a reaction between the known total quantity of the etchant molecules and the known total quantity of the unmasked first layer molecules, the first layer being a P silicon semiconductor layer, the second layer being an N+ silicon semiconductor layer whereby the second layer is etched by the unconsumed quantity of etchant molecules at essentially the same rate as the first layer.

2. The improvement in the method of claim 1 wherein the silicon is monocrystalline.

* * * * *